United States Patent [19]
Onishi et al.

[11] Patent Number: 5,638,319
[45] Date of Patent: Jun. 10, 1997

[54] NON-VOLATILE RANDOM ACCESS MEMORY AND FABRICATION METHOD THEREOF

[75] Inventors: Shigeo Onishi, Nara; Kazuya Ishihara, Kyoto, both of Japan

[73] Assignee: Sharp Kabushiki Kaisha, Osaka, Japan

[21] Appl. No.: 567,907

[22] Filed: Dec. 6, 1995

[30] Foreign Application Priority Data

Jun. 5, 1995 [JP] Japan .................................. 7-138262

[51] Int. Cl.$^6$ .............................. G11C 11/22; H01L 29/78
[52] U.S. Cl. ............................................ 365/145; 257/295
[58] Field of Search .................................. 365/145, 149; 257/295, 298

[56] References Cited

U.S. PATENT DOCUMENTS

| | | | |
|---|---|---|---|
| 5,119,154 | 6/1992 | Gnadinger | 257/295 |
| 5,212,620 | 5/1993 | Evans et al. | 365/145 |
| 5,227,855 | 7/1993 | Momose | 365/154 |
| 5,293,510 | 3/1994 | Takenaka | 365/145 |
| 5,369,296 | 11/1994 | Kato | 365/145 |
| 5,371,700 | 12/1994 | Hamada | 365/149 |
| 5,481,490 | 1/1996 | Watanabe | 365/145 |

FOREIGN PATENT DOCUMENTS 3-296262   3/1991   Japan .
4-356958   11/1992  Japan .

OTHER PUBLICATIONS

"International Electron Devices Meeting 1994", Table of Contents, and A Half–Micron Ferroelectric Memory Cell Technology with Stacked Capacitor Structure ONISHI et al, pp. 843–846.

*Primary Examiner*—David C. Nelms
*Assistant Examiner*—Son Mai
*Attorney, Agent, or Firm*—Nixon & Vanderhye, P.C.

[57] ABSTRACT

A non-volatile random access memory comprises an MOS transistor having a gate insulation film formed on a semiconductor substrate, a gate electrode formed on the gate insulation film, and a pair of diffusion layers formed in the semiconductor substrate; and a ferroelectric capacitor having a bottom electrode connected to one of the diffusion layers of the MOS transistor, a capacitor ferroelectric film formed only on the bottom electrode, and a top electrode formed on the capacitor ferroelectric film; wherein at least side walls of the bottom electrode and the capacitor ferroelectric film are coated with lamination of a diffusion prevention film and a thin insulation film; an upper surface of the capacitor ferroelectric film is contacted with the top electrode; the other diffusion layer of the MOS transistor is connected to a bit line; the gate electrode is connected to a word line; and the top electrode of the ferroelectric capacitor is constituted so as to serve as a drive line.

8 Claims, 9 Drawing Sheets

NON-VOLATILE RANDOM ACCESS MEMORY AND FABRICATION METHOD THEREOF

BACKGROUND OF THE INVENTION

1. Field of the Invention

The present invention relates to a non-volatile random access memory and a fabrication method thereof and, more particularly, to a high-density non-volatile random access memory using a ferroelectric film as a capacitor insulation film and a fabrication method thereof.

2. Description of Related Arts

Typical randomly accessible memory devices include an SRAM (static random access memory) and DRAM (dynamic random access memory), which are both volatile memories. The former requires six transistors for one memory cell, thereby imposing a limitation on higher integration. The later suffers from an increased power consumption because capacitors thereof require periodical refreshing for data retention.

Recently, FRAMs (ferroelectric random access memories) employing a ferroelectric film as a capacitor dielectric film thereof have been attracting increasing attention. To reduce an area occupied by memory cells, a stacked memory cell structure is realized in some of the FRAMs, which structure is often employed in DRAMs.

Such stacked FRAM cells are proposed, for example, in Japanese Unexamined Patent Publications No. 3-296262 (1991) and No. 4-356958 (1992).

FIG. 12 illustrates one exemplary memory cell of the stacked FRAMs in accordance with the aforesaid publications. The memory cell comprises an MOS transistor having a gate electrode 43 formed on a semiconductor substrate 41 with intervention of a gate insulation film 42 and a pair of source/drain regions 44, a ferroelectric capacitor having a bottom electrode 49 connected to one of the source/drain regions 44 of the MOS transistor via a contact plug 45, a PZT ferroelectric film 50 fully covering the bottom electrode 49 and a top electrode 51 fully covering the ferroelectric film 50. The other source/drain region 44 of the MOS transistor is connected to a bit line 48, and a BPSG film and $SiO_2$ film are formed as interlayer insulation films 46 and 47 on the MOS transistor and the ferroelectric capacitor, respectively. A drive line 52 extending perpendicular to the extension direction of the gate electrode 43 is connected to the top electrode 51 of the ferroelectric capacitor.

FIG. 13 illustrates memory cell of a stacked FRAM of another type. The memory cell has substantially the same construction as that shown in FIG. 12, except that the edges of the bottom electrode 53, ferroelectric film 54 and top electrode 55 of the ferroelectric capacitor are aligned.

In the memory cell shown in FIG. 13, however, it is difficult to control etching of the three-layered films 53, 54 and 55 which comprises the capacitor. Also it is not possible to form the top electrode 55 in an desired shape, so that it is necessary to form a separate drive line.

In the memory cell of the FRAM shown in FIG. 12, since the top electrode 51 fully covers the ferroelectric film 50 which covers the bottom electrode 49, the side portions of the ferroelectric film 50 do not directly contact the $SiO_2$ film 47. However, since the ferroelectric film 50 is formed to be in contact with the interlayer insulation film 46, an interdiffusion occurs between the interlayer insulation film 46 and the ferroelectric film 50 in an annealing process for crystallization, resulting in peeling-off of the ferroelectric film. Moreover, additional photolithographic and etching processes are required for the patterning of the ferroelectric film 50 and the top electrode 51. Further, the ferroelectric film 50 may be contaminated or damaged in the photolithographic and etching processes. Therefore, it is preferred that the ferroelectric film 50 be etched together with a top electrode material after the top electrode material is deposited on the ferroelectric film 50. In FIG. 13 also, the side surface of the ferroelectric film 54 comes in contact with the interlayer insulation film 47, so that an interdiffusion might possibly occur during the formation of the interlayer insulation film 47. However, since the temperature for forming the interlayer insulation film is lower than the temperature for crystallization of the ferroelectric film, the degree of interdiffusion is lower in the case of FIG. 13 than in the case of FIG. 12.

In a still another prior art, the top electrode 51 or 55 of the ferroelectric capacitor is provided as a common plate electrode for memory cells. However, when a predetermined voltage is applied to the top electrode 51 or 55 to rewrite or read out data, memory cells surrounding the selected memory cell are liable to be disturbed.

SUMMARY OF THE INVENTION

The present invention provides a non-volatile random access memory (A) comprising: an MOS transistor having a gate insulation film formed on a semiconductor substrate, a gate electrode formed on the gate insulation film, and a pair of diffusion layers formed in the semiconductor substrate; and a ferroelectric capacitor having a bottom electrode connected to one of the diffusion layers of the MOS transistor, a capacitor ferroelectric film formed only on the bottom electrode, and a top electrode formed on the capacitor ferroelectric film; wherein at least side walls of the bottom electrode and the capacitor ferroelectric film are coated with lamination of a diffusion prevention film and a thin insulation film; an upper surface of the capacitor ferroelectric film is contacted with the top electrode; the other diffusion layer of the MOS transistor is connected to a bit line; the gate electrode is connected to a word line; and the top electrode of the ferroelectric capacitor is constituted so as to serve as a drive line.

Further the present invention provides a non-volatile random access memory (B) comprising: an MOS transistor having a gate insulation film formed on a semiconductor substrate, a gate electrode formed on the gate insulation film, and a pair of diffusion layers formed in the semiconductor substrate; an interlayer insulation film covering the MOS transistor; and a ferroelectric capacitor having a bottom electrode connected to one of the diffusion layers of the MOS transistor through a contact hole formed in the interlayer insulation film on said one diffusion layer, a capacitor ferroelectric film covering the bottom electrode, and a top electrode formed on the capacitor ferroelectric film; wherein a diffusion prevention film is formed between the interlayer insulation film and the bottom electrode; the other diffusion layer of the MOS transistor is connected to a bit line; the gate electrode is connected to a word line; and the top electrode of the ferroelectric capacitor is constituted so as to serve as a drive line.

Moreover the above mentioned non-volatile random access memory (A) can be fabricated by the steps of: (I) forming on a semiconductor substrate an MOS transistor having a gate insulation film, a Kate electrode and a pair of diffusion layers, and depositing an interlayer insulation film on the MOS transistor; (II) forming a contact hole extending through the interlayer insulation film down to one of the diffusion layers, followed by forming a contact plug in the contact hole; (III) depositing a material for a bottom electrode and a material for a capacitor ferroelectric film on the entire surface of the resulting substrate including the contact plug, and patterning the materials for the bottom electrode and the capacitor ferroelectric film into a desired configuration with use of a single mask to form the bottom electrode and the capacitor ferroelectric film; (IV) forming a diffusion prevention film and an insulation film on the entire surface of the resulting substrate; (V) forming an opening extending through the diffusion prevention film and the insulation film on the capacitor ferroelectric film; and (VI) depositing a material for a top electrode material on the surface of the resulting substrate including the opening, followed by patterning the material into a desired configuration to form the top electrode.

Further, the above mentioned non-volatile random access memory (B) can be fabricated by the steps of: (i) forming on a semiconductor substrate an MOS transistor having a gate insulation film, a gate electrode and a pair of diffusion layers, forming an interlayer insulation film on the MOS transistor, and further forming a diffusion prevention film on the interlayer insulation film; (ii) forming a contact hole extending through the interlayer insulation film and the diffusion prevention film down to one of the diffusion layers, followed by forming a contact plug in the contact hole; (iii) depositing a material for a bottom electrode on the entire surface of the resulting substrate including the contact plug, and patterning the material into a desired configuration to form the bottom electrode; and (iv) depositing a material for a capacitor ferroelectric film on the bottom electrode, further depositing a material for a top electrode on the ferroelectric film, and patterning the materials for the capacitor ferroelectric film and the top electrode into a desired configuration with use of a single mask to form the capacitor ferroelectric film and the top electrode.

Still further, the present invention provides the following two methods (C) and (D) for fabricating a non-volatile random access memory.

The method (C) for fabricating a non-volatile random access memory comprises the steps of: (i-a) forming on a semiconductor substrate an MOS transistor having a gate insulation film, a gate electrode and a pair of diffusion layers, and depositing a first interlayer insulation film on the MOS transistor; (ii-a) forming a contact hole extending through the first interlayer insulation film down to one of the diffusion layers, followed by forming a contact plug in the contact hole; (iii-a) depositing a material for a bottom electrode, followed by patterning the material to form the bottom electrode; (iv-a) forming a diffusion prevention film on the entire surface of the resulting substrate, planarizing a surface of the diffusion prevention film to expose a surface of the bottom electrode; (v-a) depositing a material for a capacitor ferroelectric film on the entire surface of the resulting substrate, and patterning the material for the capacitor ferroelectric film into a desired configuration so as to cover at least the entire surface of the bottom electrode; (vi-a) forming a second interlayer insulation film on the entire surface of the capacitor ferroelectric film; (vii-a) forming an opening extending through the second interlayer insulation film on the capacitor ferroelectric film; and (viii-a) depositing a material for a top electrode on the surface of the resulting substrate including the opening, followed by patterning the material into a desired configuration to form the top electrode.

The method (D) for fabricating a non-volatile random access memory comprises the steps of: (i-b) forming on a semiconductor substrate an MOS transistor having a gate insulation film, a gate electrode and a pair of diffusion layers, and depositing a first interlayer insulation film on the MOS transistor; (ii-b) forming a contact hole extending through the first interlayer insulation film down to one of the diffusion layers, followed by forming a contact plug in the contact hole; (iii-b) depositing a material for a bottom electrode, followed by patterning the material to form the bottom electrode; (iv-b) forming a diffusion prevention film on the entire surface of the resulting substrate, planarizing a surface of the diffusion prevention film to expose a surface of the bottom electrode; (v-b) depositing materials for a capacitor ferroelectric film and a top electrode on the entire surface of the resulting substrate, and patterning the materials into a desired configuration so as to cover at least the entire surface of the bottom electrode with use of a single mask to form the capacitor ferroelectric film and the top electrode.

DETAILED DESCRIPTION OF THE PREFERRED EMBODIMENTS

Figure 1:
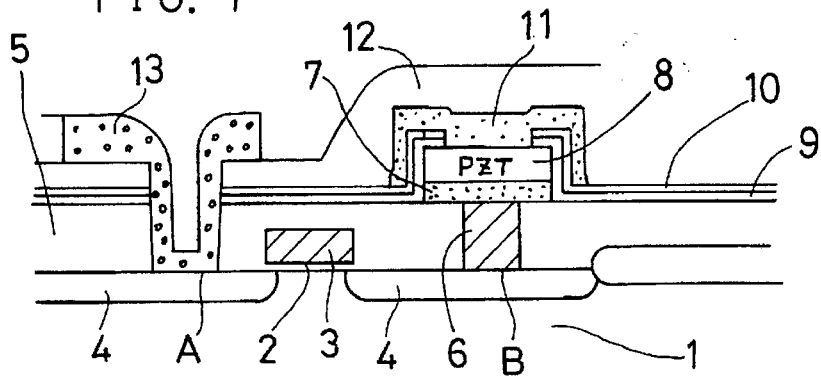
FIG. 1 is a schematic sectional view illustrating an FRAM cell in accordance with one embodiment of the present invention.

An FRAM in accordance with the present invention mainly includes one MOS transistor and one ferroelectric capacitor stacked thereon.

The MOS transistor has a gate insulation film formed on a semiconductor substrate, a gate electrode, and a pair of diffusion layers. The semiconductor substrate is not particularly limited, but is selected from those commonly used as a substrate. Examples of the semiconductor substrate to be preferably used include a silicon substrate. The materials, thicknesses and sizes of the gate insulation film, gate electrode and diffusion layer are those commonly employed for the formation of a typical transistor.

The ferroelectric capacitor includes a bottom electrode, a ferroelectric film serving as a capacitor insulation film, and a top electrode. The bottom and top electrodes are formed of conductive materials commonly used for the formation of an electrode. Exemplary materials to be used for the formation of the bottom and top electrodes include single layer films such as of Pt, Ti, $RuO_2$ and $IrO_2$, and lamination of two or more layers such as Pt/Ti, Pt/Ti/TiN, Pt/TiN/Pt, Ti/Pt/Ti, TiN/Pt/TiN, Pt/Ti/TiN/Ti, $RuO_2$/TiN, $IrO_2$/Ir and $IrO_2$/TiN. The film thickness is not particularly limited, but is appropriately adjusted depending on the material of the electrode, the size of the capacitor and the like. The electrodes are each preferably formed as having a thickness of about 200 Å to about 5000 Å. The capacitor dielectric film is preferably formed of a ferroelectric material such as PZT, PLZT, $SrBi_2$, $Ta_{2-x}Nb_xO_9$ or the like as having a thickness of about 1000 Å to about 2000 Å.

One of the diffusion layers of the MOS transistor is connected to the bottom electrode of the ferroelectric capacitor, for example, via a contact plug made of a conductive material. The conductive material is not particularly limited, but may be formed of a single layer of a metal, polysilicon doped with an impurity, diffusion barrier film such as TiN, or the like, or may be formed with an intervention of a barrier metal such as Ti or the like.

One feature of the ferroelectric capacitor according to the present invention is that a diffusion prevention film is interposed between the ferroelectric film and an interlayer insulation film to prevent deterioration or peeling-off of the ferroelectric film which would occur where the ferroelectric film held between the top and bottom electrodes directly contacts an $SiO_2$ film serving as the interlayer insulation film, an underlying NSG film, BPSG film and the like.

More specifically, (a) where the bottom electrode, the ferroelectric film and top electrode have the same configuration with the edges thereof aligned, and an $SiO_2$ film, NSG film, BPSG film or the like is formed to cover the top electrode as an interlayer insulation film; or (b) where the bottom electrode and the ferroelectric film have the same configuration with the edges thereof aligned, and the top electrode covers part of the ferroelectric film; and an $SiO_2$ film, NSG film, BPSG film or the like is formed to cover the top electrode as an interlayer insulation film, portions of the ferroelectric film appearing on the side faces of the ferroelectric capacitor would directly contact the $SiO_2$ film or the like. In these cases, lamination of a diffusion prevention film and a thin insulation film (respectively corresponding to a $TiO_2$ film and an $SiO_2$ film in FIG. 1) or a spacer of a diffusion prevention film (corresponding to a spacer of $TiO_2$ in FIG. 8) is preferably provided on the side faces of the ferroelectric capacitor.

(c) Where the top electrode is formed on the ferroelectric film which fully covers the bottom electrode, and the ferroelectric film and the top electrode have the same configuration with the edges thereof aligned, and an $SiO_2$ film, NSG film, BPSG film or the like is formed under the capacitor as an interlayer insulation film; or (d) where the top electrode covers the ferroelectric film which covers the bottom electrode; and an $SiO_2$ film, NSG film, BPSG film or the like is formed under the capacitor as an interlayer insulation film, portions of the ferroelectric film appearing on the bottom face of the ferroelectric capacitor would directly contact the underlying $SiO_2$ film or the like. In these cases, the diffusion prevention film (corresponding to $TiO_2$ films in FIGS. 5 and 8) is preferably provided on the interlayer insulation film, on which diffusion prevention film is formed the ferroelectric capacitor.

(e) Where the top electrode is formed on the ferroelectric film covering the bottom electrode, and the ferroelectric film and the top electrode have the same configuration with the edges thereof aligned, and an $SiO_2$ film, NSG film, BPSG film or the like is formed over the capacitor and below the capacitor as interlayer insulation films, portions of the ferroelectric film appearing on the side faces and bottom face of the ferroelectric capacitor would directly contact the overlying $SiO_2$ film and the underlying $SiO_2$ film or the like. In these cases, a spacer of a diffusion prevention film (corresponding to a spacer of $TiO_2$ film) is preferably provided on the side faces of the ferroelectric capacitor, and a diffusion prevention film is preferably provided on the interlayer insulation film (corresponding to $TiO_2$ film in FIG. 8), on which diffusion prevention film is formed the ferroelectric capacitor.

Exemplary materials of the diffusion prevention film to be used in the present invention include metal oxides such as $TiO_2$, $ZrO_2$ and $Al_2O_3$. The thickness of the diffusion prevention film is not particularly limited. Where the diffusion prevention film is formed as the spacer, for example, the thickness thereof is preferably about 300 Å to about 1000 Å. Where the diffusion prevention film is formed as lamination with the thin insulation film, the thickness thereof is preferably about 300 Å to about 1000 Å. Where the diffusion prevention film is formed on the entire top surface of the interlayer insulation film, the thickness thereof is preferably about 300 Å to about 1000 Å. The thin insulation film to be used as lamination with the diffusion prevention film is preferably formed of $SiO_2$, SiN or the like as having a thickness of about 500 Å to about 1500 Å.

In the FRAM of the present invention, the gate electrode of the MOS transistor functions as a word line, and the other diffusion layer of the MOS transistor is connected to a bit line. Further, the top electrode of the ferroelectric capacitor is constituted so as to serve as a drive line, and extends parallel to the bit line or the word line. To prevent a selected cell from disturbing adjacent cells, the top electrode (drive line) preferably extends parallel to the word line.

In step (I) of a method for fabricating the FRAM in accordance with the present invention, an MOS transistor is formed on a semiconductor substrate, and an interlayer insulation film is deposited on the MOS transistor. The gate insulation film, gate electrode, diffusion layers and interlayer insulation film of the MOS transistor can be formed of $SiO_2$, NSG, BPSG or the like by a known method.

In step (II), a contact hole is formed as extending through the interlayer insulation film down to one of the diffusion layers, and a contact plug is formed in the contact hole. The contact hole can be formed by a known process, for example, photolithographic process and dry etching with $CF_4/CHF_3$ gas or wet etching. The contact plug can be formed by depositing a conductive material on the substrate surface including the contact hole and etching back the conductive material, for example, by a CMP (chemical mechanical polishing) method.

In step (III), a material for a bottom electrode and a material for a capacitor ferroelectric film are sequentially deposited entirely on the resulting substrate surface, and patterned into a desired configuration with use of a single mask to form the bottom electrode and the capacitor ferroelectric film. The deposition of the material for the bottom electrode material can be achieved by, for example, a PVD method or sputtering method. The ferroelectric film can be formed by an MOCVD method, sol-gel method or sputtering method, but the MOCVD method is preferable in terms of step coverage. The patterning of the materials for the bottom electrode and the capacitor ferroelectric film is achieved by, for example, dry etching with chlorine- or fluorine-based gas. To recover an etching damage to the surface of the capacitor ferroelectric film, RTA is preferably performed at a temperature of about 500° C. to about 600° C. in an oxygen atmosphere for about 10 seconds to about 60 seconds.

In step (IV), a diffusion prevention film and an insulation film are formed entirely on the resulting substrate surface. The formation of the diffusion prevention film is achieved by depositing a metal layer on the substrate by a sputtering method and then annealing the substrate at a temperature of about 500° C. to about 600° C. in an oxygen atmosphere, or by a reactive sputtering method. However, the sputtering/annealing method results in poor step coverage, and oxidation occurring after the formation of the metal layer causes the crystallization of the metal layer, thereby making the subsequent etching process difficult. Since the reactive sputtering method makes it possible to perform annealing at a relatively low temperature of about 200° C., the metal oxide film grows into an amorphous state, thereby facilitating the subsequent etching process.

In step (V), an opening is formed as extending through the diffusion prevention film and insulation film on the capacitor ferroelectric film. These films are preferably etched with $CHF_3$, $CF_4$ or the like after a mask of a desired configuration is formed thereon. To recover an etching damage to a portion around the opening of the capacitor ferroelectric film, RTA is preferably performed at a temperature of about 500° C. to about 600° C. in an oxygen atmosphere for about 10 seconds to about 60 seconds.

In step (VI), a material for a top electrode is deposited on the resulting substrate surface, and patterned into a desired configuration to form the top electrode. Methods for depositing and patterning the material for the top electrode depend on the material to be used, but may be substantially the same as those employed for the material for the bottom electrode.

After the fabrication of the MOS transistor and the ferroelectric capacitor, an interlayer insulation film is formed as having a thickness of about 2000 Å to about 6000 Å on the entire surface of the resulting substrate by a known method.

In the aforesaid method for fabricating the ferroelectric capacitor, the formation of three masks is required for the patterning of the bottom electrode/ferroelectric film, the forming of the opening in the diffusion prevention film/thin insulation film, and the patterning of the top electrode. In addition, the etching process for the formation of the opening in the diffusion prevention film/thin insulation film may damage the ferroelectric film.

To solve this problem, another fabrication method is proposed, in which substantially the same processes as the steps (I) to (VI) are performed in the order of steps (i) to (iv). This fabrication method requires only two mask formation processes, i.e., for the patterning to form the bottom electrode and for the patterning to form the capacitor ferroelectric film/top electrode, thereby realizing the fabrication of the FRAM by a reduced number of process steps. Further, this fabrication method avoids the etching damage to the ferroelectric film. The patterning of the materials for the top electrode and the capacitor ferroelectric film in the step (iv) can be performed in the same manner as in the step (III). To recover an etching damage such as charge-up inflicted on the top electrode, RTA is preferably performed at a temperature of about 550° C. to about 650° C. in an oxygen atmosphere for about 10 seconds to about 60 seconds.

Where the capacitor ferroelectric film appears on the side faces of the ferroelectric capacitor, a spacer made of a material identical with or different from that of the diffusion prevention film is provided on the side walls of the capacitor ferroelectric film in step (v). Such diffusion prevention film can be formed in substantially the same manner as described above, and etched by an anisotropic etching such as RIE for the formation of the spacer.

The fabrication method of a non-volatile random access memory according to the present invention may substantially follow the method of (i-a) to (viii-a) or (i-b) to (v-b) besides the above method of (I) to (VI) or (i) to (iv).

Here, as the first and/or the second interlayer insulation film, a known insulation film such as $SiO_2$, SiN, PSG, NSO, BPSG or the like may be used, among them SiN is preferable as second interlayer insulation film. The second interlayer insulation film is preferably formed as having a thickness of about 500 angstrom to about 1500 angstrom.

Also, the diffusion prevention film in the above method of (i-a) to (viii-a) or (i-b) to (v-b) may be formed to a desired thickness by a method similar to the above or a method as explained below.

With reference to the attached drawings, non-volatile RAMs of the present invention will hereinafter be described by way of examples thereof.

EXAMPLE 1

A cell of a non-volatile RAM according to the present invention mainly includes one transistor and one ferroelectric capacitor as shown in FIG. 1. The transistor is formed on a semiconductor substrate 1 with intervention of a gate insulation film 2, and comprises a gate electrode 3 functioning as a word line, and source/drain regions 4 formed in self-alignment with the gate electrode 3. The ferroelectric capacitor comprises a bottom electrode 7, a capacitor ferroelectric film 8 formed only on the bottom electrode 7, and a top electrode 11 formed on the ferroelectric film 8 and functioning as a drive line. An interlayer insulation film 5 is formed of BPSG on the transistor, and the ferroelectric capacitor is disposed on the interlayer insulation film 5. An interlayer insulation film 12 is formed of $SiO_2$ on the ferroelectric capacitor. The bottom electrode 7 of the ferroelectric capacitor is connected to one of the source/drain regions 4 via a contact plug 6 formed in the interlayer insulation film 5. Side walls of the bottom electrode 7 and the capacitor ferroelectric film 8 are covered with lamination of a $TiO_2$ film 9 and an $SiO_2$ film 10 having an opening on the capacitor ferroelectric film 8 and extending therefrom to cover the entire upper surface of the interlayer insulation film 5. The top electrode 11 is formed to cover the bottom electrode 7, the capacitor ferroelectric film 8, and the lamination of the $TiO_2$ film 9 and $SiO_2$ film 10. The other source/drain region 4 is connected to a hit line 13.

Figure 2:
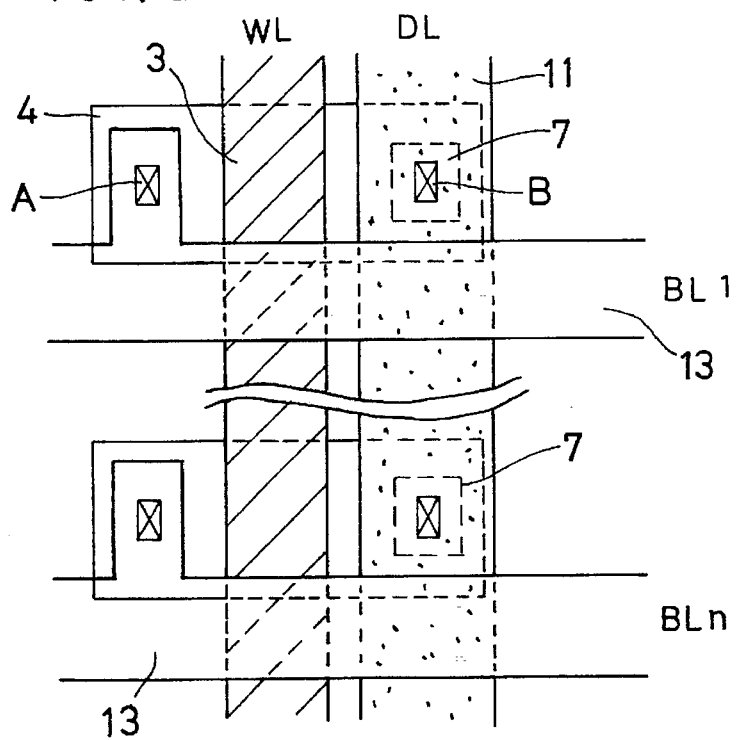
FIG. 2 is a schematic plan view illustrating the major portion of the FRAM cell shown in FIG. 1.
Figure 3:
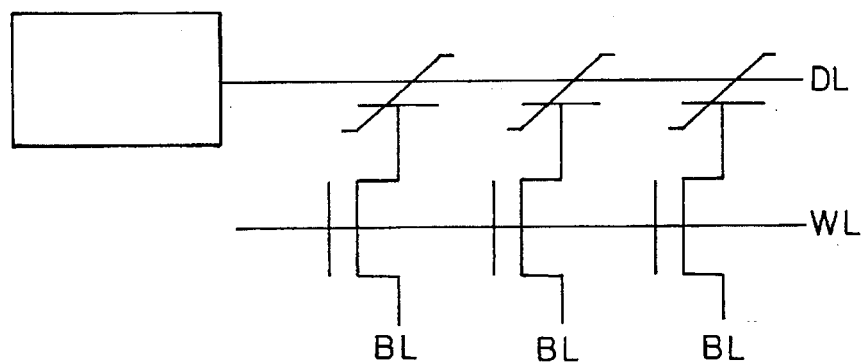
FIG. 3 is an equivalent circuit diagram of the FRAM cell shown in FIG. 1.

In the memory cell having such a construction, the top 20 electrode 11 serving as a drive line common to other memory cells extends parallel to the word line (gate electrode 3) as shown in the plan view of FIG. 2 and in the equivalent circuit diagram of FIG. 3. This makes it possible to prevent cells adjacent to a selected cell from being disturbed during the data rewrite of or data read-out from the selected cell. Further, the TiO₂ film 9 is provided between the capacitor ferroelectric film 8 and the SiO₂ film 10 to prevent the capacitor ferroelectric film 8 from directly contacting the SiO₂ film 10, thereby preventing the degradation or peeling-off of the capacitor ferroelectric film 8.

An FRAM as described above is fabricated in the following manner.

Figure 4:
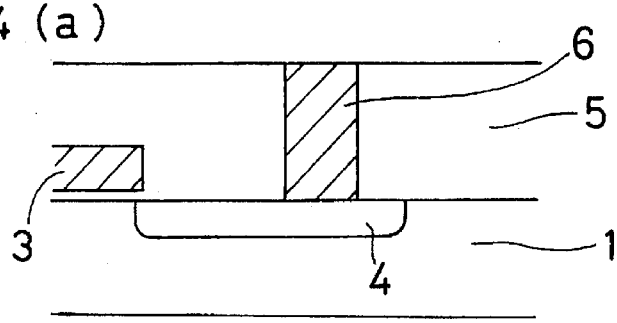
FIGS. 4(a) to 4(d) are schematic fabrication process flow diagrams illustrating a method for fabricating a ferroelectric capacitor of the FRAM cell shown in FIG. 1.
Figure 4:
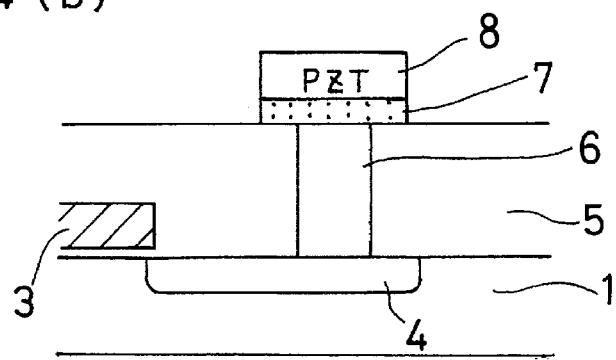
Figure 4:
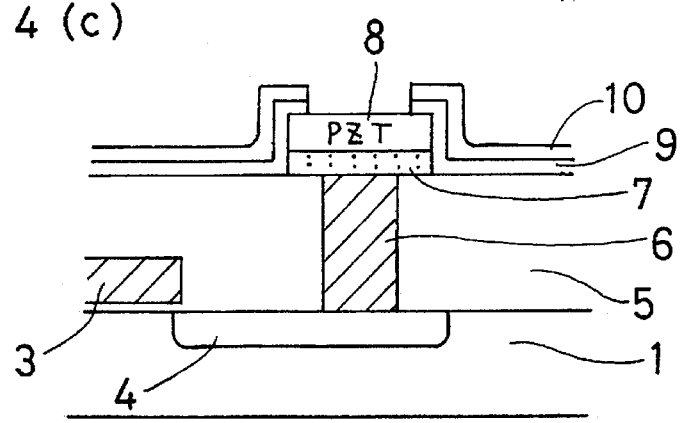
Figure 4:
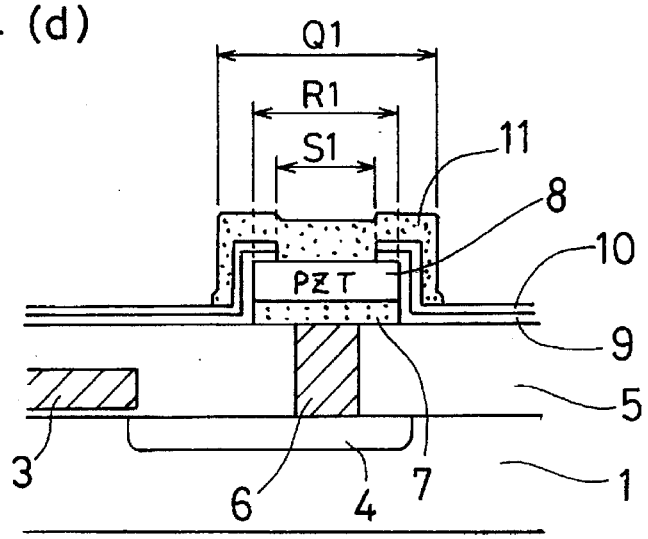

As shown in FIG. 4(a), a BPSG film 5 is formed as an interlayer insulation film on a semiconductor substrate 1 having an MOS-FET, and reflowed for planarization. In turn, a mask (not shown) is formed on the BPSG film 5 by a contact photolithographic process, and the BPSG film 5 is etched with CF₄/CHF₃ gas by using the mask for the formation of a contact hole reaching one of source/drain regions 4 of the MOS-FET. Polysilicon is deposited as having a thickness of 4500 Å on the surface of the resulting substrate including the contact hole, and doped with phosphorus by thermal diffusion. The polysilicon layer on the BPSG film 5 is etched back by a CMP method to be completely removed for the formation of a contact plug 6. The roughness of the contact plug 6 after the etching-back is less than 300 Å.

In turn, as shown in FIG. 4(b), Pt (500 Å to 1000 Å)/Ti (200 Å)/TiN (500 Å to 1000 Å)/Ti (200 Å) is deposited as a bottom electrode material over the contact plug 6 by a sputtering method. Then, a PZT film with a thickness of about 1000 Å to 2000 Å is formed as a ferroelectric film on the bottom electrode material by an MOCVD method, and crystallized at a temperature of 550° C. to 650° C. Thereafter, a mask (not shown) is formed on the PZT film by a photolithographic process, and the bottom electrode material and the PZT film are simultaneously patterned with chlorine- or fluorine-based gas by using the mask for the formation of the bottom electrode 7 and the capacitor ferroelectric film 8.

Subsequently, as shown in FIG. 4(c), a TiO₂ film 9 with a thickness of 300 Å to 1000 Å is formed on the capacitor ferroelectric film 8 by a reactive sputtering method, and an SiO₂ film 10 with a thickness of 300 Å to 1000 Å is formed thereon. Then, an opening having a desired configuration is formed as extending through the lamination of the TiO₂ film 9 and the SiO₂ film 10 on the capacitor ferroelectric film 8 by photolithographic and etching processes. To recover an etching damage to the capacitor ferroelectric film 8 around the opening of the lamination of the TiO₂ film 9 and SiO₂ film 10, RTA is performed at a temperature of 500° C. to 600° C. in an oxygen atmosphere for 30 seconds.

As shown in FIG. 4(d), Pt is deposited as having a thickness of 500 Å to 1000 Å as a top electrode material on the lamination of the TiO₂ film 9 and SiO₂ film 10 including the opening by a sputtering method. A mask is formed on the Pt layer by a photolithographic method, and the Pt layer is patterned with chlorine- or fluorine-based gas by using the mask for the formation of a top electrode 11 functioning as a drive line.

Further, SiO₂ (indicated by a reference numeral 12 in FIG. 1) is deposited as having a thickness of 2000 Å to 3000 Å on the entire surface of the resulting substrate by a CVD method and, after a contact hole is formed therein, a bit line (indicated by a reference numeral 13 in FIG. 1) connecting to the other source/drain region 4 of the MOS transistor is formed of Al.Si.Cu/TiN/Ti. Thus, the non-volatile RAM shown FIG. 1 is fabricated.

Where the ferroelectric capacitor of the FRAM has a capacitor size S1 of 1 μm as shown in FIG. 4(d) and a 0.5 μm design rule is adopted, for example, the ferroelectric capacitor has the following dimensional features: the size R1 of the bottom electrode is 1.5 μm with a capacitor size of 1 μm plus design margins of the bottom electrode of 0.25 μm; and the size Q1 of the top electrode is 2.0 μm with a bottom electrode size R1 of 1.5 μm plus design margins of the top electrode of 0.25 μm.

EXAMPLE 2

Figure 5:
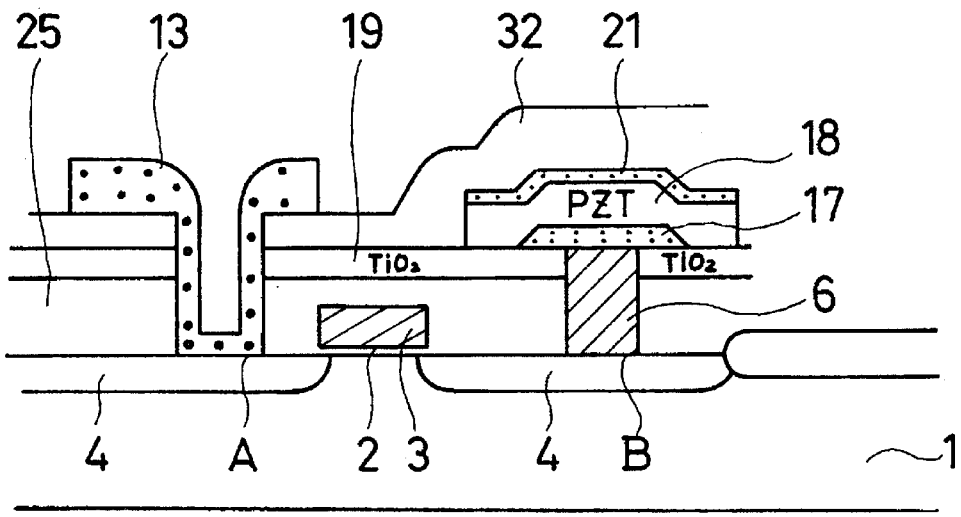
FIG. 5 is a schematic sectional view illustrating an FRAM cell in accordance with another embodiment of the present invention.

In accordance with Example 1, the fabrication of the FRAM requires an increased number of photolithographic and etching processes for the formation of the TiO₂ film 9 and SiO₂ film 10, and the capacitor ferroelectric film 8 is unavoidably contaminated and damaged by the photolithographic and etching processes. In view of the foregoing, a nonvolatile RAM as shown in FIG. 5 is proposed. The FRAM cell mainly includes one transistor and one ferroelectric capacitor. The construction of the transistor is the same as that in Example 1 (FIG. 1). An SiO₂ film 25 is formed as an interlayer insulation film on the MOS transistor, and a TiO₂ film 19 is formed on the SiO₂ film 25. The ferroelectric capacitor, which is formed on the TiO₂ film 19, comprises a bottom electrode 17, a capacitor ferroelectric film 18 covering the bottom electrode 17 and a top electrode 21 functioning as a drive line. On the ferroelectric capacitor is formed an SiO₂ film 32 as an interlayer insulation film. One of source/drain regions 4 of the transistor is connected to the bottom electrode 17 of the ferroelectric capacitor and the other source/drain region 4 is connected to a bit line in the same manner as in Example 1.

Figure 6:
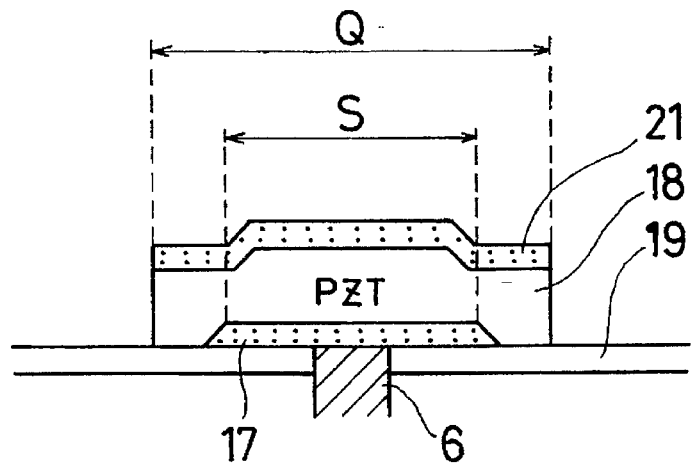
FIG. 6 is a schematic sectional view illustrating the major portion of a ferroelectric capacitor of the FRAM cell shown in FIG. 5 for showing the size of the ferroelectric capacitor.

In the memory cell having the aforesaid construction, like the memory cell in Example 1, the top electrode 21 is provided as a drive line extending parallel to a word line (gate electrode 3). This makes it possible to prevent cells adjacent to a selected cell from being disturbed during the data rewrite of or data read-out from the selected cell. The TiO₂ film 19 is provided between the capacitor ferroelectric film 18 and the SiO₂ film 25 to prevent the capacitor ferroelectric film 18 from directly contacting the SiO₂ film 25. Therefore, the deterioration and peeling-off of the capacitor ferroelectric film 18 can be prevented.

Where the ferroelectric capacitor of the FRAM of Example 2 has a capacitor size S of 1 μm as shown in FIG. 6 and a 0.5 μm design rule is adopted, the ferroelectric capacitor has the following dimensional features: the size of the bottom electrode is 1 μm which is the same as the capacitor size; and the size Q of the top electrode is 1.5 μm with a bottom electrode size of 1 μm plus design margins of the top electrode of 0.25 μm. Thus, the ferroelectric capacitor of the FRAM of the Example 2 has a further reduced size in comparison with the FRAM of Example 1.

An FRAM as described above is fabricated in the following manner.

A device isolation film (not shown) is formed on a semiconductor substrate 1 and, after an active region is defined in the semiconductor substrate 1, an MOS transistor is formed by a typical transistor fabrication process.

Figure 7A:
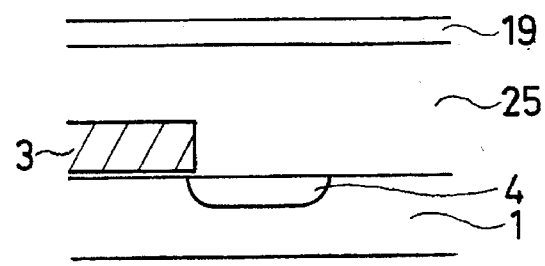
FIGS. 7(a) to 7(c) are schematic fabrication process flow diagrams illustrating a method for fabricating a ferroelectric capacitor of the FRAM cell shown in FIG. 5.

In turn, as shown in FIG. 7(a), an SiO₂ film 25 is formed as an interlayer insulation film on the semiconductor substrate 1 including the MOS transistor, and then a TiO₂ film 19 with a thickness of 300 Å to 1000 Å is formed thereon by a reactive sputtering method.

Figure 7B:
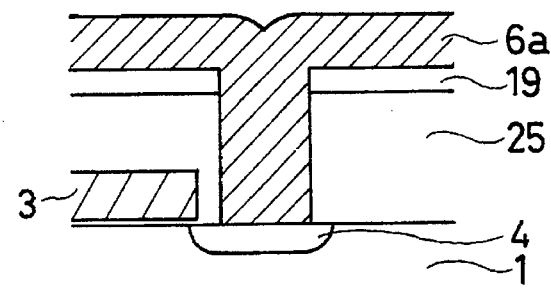

As shown in FIG. 7(b), a mask (not shown) is formed on the TiO₂ film 19 by a contact photolithographic process. By using the mask, the TiO$_2$ film 19 is etched with Cl$_2$/Ar gas, and then the SiO$_2$ film 25 is etched with CF$_4$/CHF$_3$ gas for the formation of a contact hole reaching one of source/drain regions 4 of the MOS transistor. Thereafter, polysilicon is deposited as having a thickness of 4500 Å on the resulting substrate including the contact hole, and doped with phosphorus by thermal diffusion.

Figure 7C:
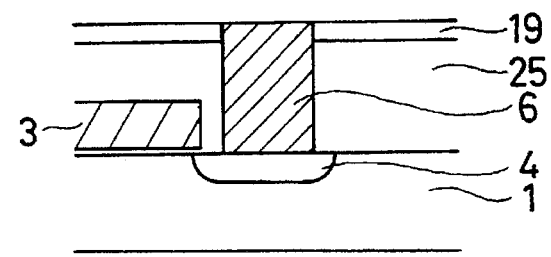

As shown in FIG. 7(c), a polysilicon layer 6a thus formed on the TiO$_2$ film 19 is etched back by a CMP method to be removed for the formation of a contact plug 6. At this time, the selective etching ratio of the polysilicon layer 6a to the TiO$_2$ film 19 is greater than 100 and, therefore, the TiO$_2$ film is hardly etched.

Figure 7D:
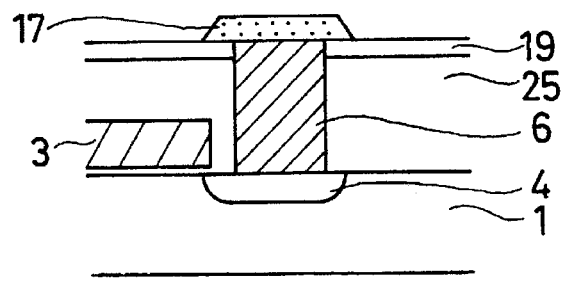

As shown in FIG. 7(d), a bottom electrode material is deposited by a sputtering method in the same manner as in Example 1, and subjected to a photolithographic process and etching process with chlorine- or fluorine-based gas for the formation of a bottom electrode 17 having a desired configuration.

Figure 7E:
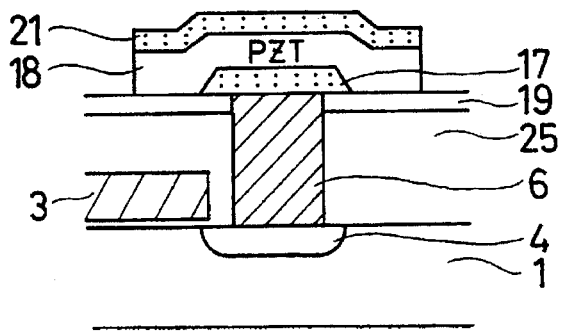

In turn, as shown in FIG. 7(e), a PZT film with a thickness of about 2000 Å is formed on the entire surface of the resulting substrate by a MOCVD method, and crystallized at a temperature of 550° C. to 650° C. A top electrode material (Pt) is deposited on the PZT film by a sputtering method in the same manner as in Example 1. By using a mask formed by a photolithographic process, the top electrode material and the PZT film are simultaneously patterned with chlorine or fluorine-based gas for the formation of the capacitor ferroelectric film 18 and the top electrode 21. To recover an etching damage such as charge-up inflicted on the Pt top electrode, RTA is performed at a temperature of 550° C. to 600° C. in an oxygen atmosphere for 30 seconds. At this time, peeling-off of the ferroelectric film 18 does not occur because the TiO$_2$ film 19 prevents the ferroelectric film 18 from directly contacting the SiO$_2$ film 25.

An SiO$_2$ film (indicated by a reference numeral 32 in FIG. 5) with a thickness of 2000 Å to 3000 Å is formed on the entire surface of the resulting substrate by a CVD method and, after the formation of a contact hole, a bit line (indicated by a reference numeral 13 in FIG. 5) connecting to the other source/drain region 4 of the MOS transistor is formed of Al.Si.Cu/TiN/Ti. Thus, the non-volatile RAM shown in FIG. 5 is fabricated.

EXAMPLE 3

Figure 8:
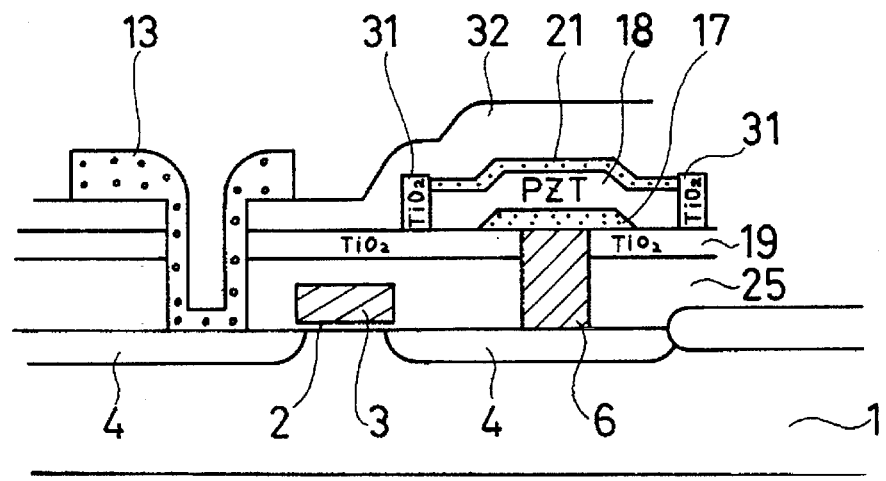
FIG. 8 is a schematic sectional view illustrating an FRAM cell in accordance with yet another embodiment of the present invention.

To ameliorate the degradation in the polarization characteristics of the ferroelectric capacitor which would occur where the SiO$_2$ film 32 is used as an interlayer insulation film to be formed on the ferroelectric capacitor as in Example 2, a non-volatile RAM as shown in FIG. 8 is proposed. The non-volatile RAM cell has substantially the same construction as that in Example 2, except that a spacer 31 is formed of TiO$_2$ on the side walls of a capacitor ferroelectric film 18 and top electrode 21 of a ferroelectric capacitor.

Figure 9:
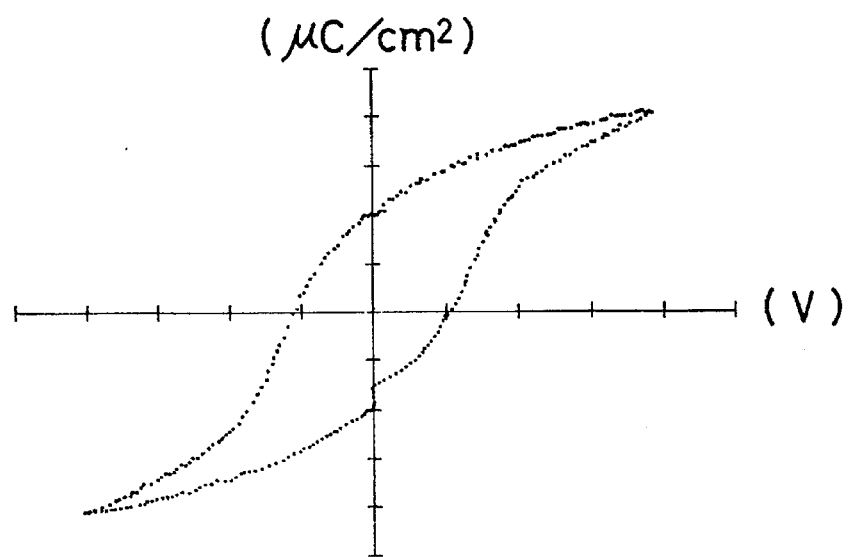
FIG. 9 is a graphical representation illustrating polarization characteristics of a ferroelectric film of the FRAM cell shown in FIG. 8.

In the memory cell having such a construction, the capacitor ferroelectric film 18 is completely isolated from the SiO$_2$ films 25 and 32 for the prevention of direct contact therewith. Therefore, the capacitor ferroelectric film 18 has excellent polarization characteristics as shown in FIG. 9 to provide stable capacitor characteristics.

In the FRAM according to Example 1 of the present invention, at least the side walls of the bottom electrode and capacitor ferroelectric film of the ferroelectric capacitor are covered with lamination of the diffusion prevention film and thin insulation film. Therefore, the degradation and peeling-off of the capacitor ferroelectric film can be prevented which would occur due to direct contact of the capacitor ferroelectric film with the interlayer insulation film of an SiO$_2$ film, NSG film or BPSG film. In the FRAM according to Example 2 of the present invention, the ferroelectric capacitor is disposed on the MOS transistor with intervention of the diffusion prevention film formed on the interlayer insulation film. Therefore, the degradation and peeling-off of the capacitor ferroelectric film can be prevented which would occur due to direct contact of the capacitor ferroelectric film with the interlayer insulation film of an SiO$_2$ film, NSG film or BPSG film.

EXAMPLE 4

Figure 10A:
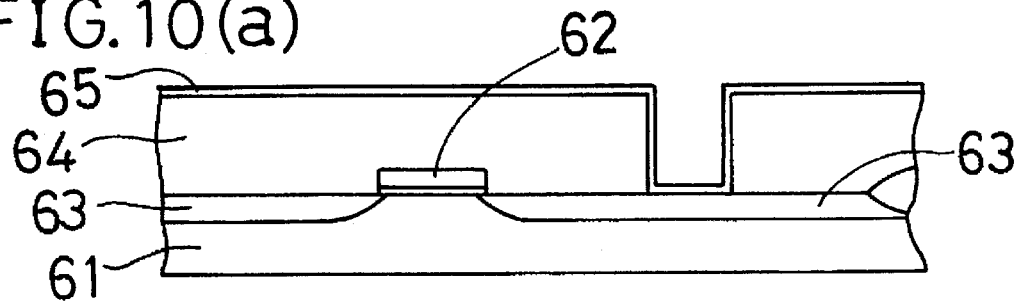
FIGS. 10(a) to 10(g) are schematic fabrication process flow diagrams illustrating another method for fabricating a ferroelectric capacitor of the FRAM cell of the present invention.
Figure 10B:
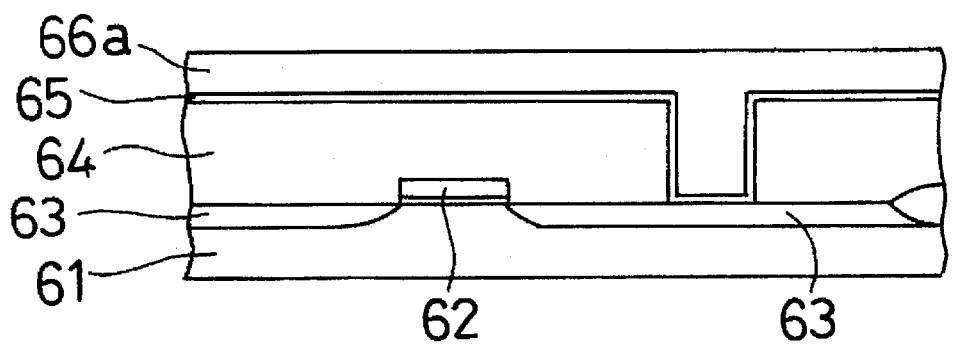
Figure 10C:
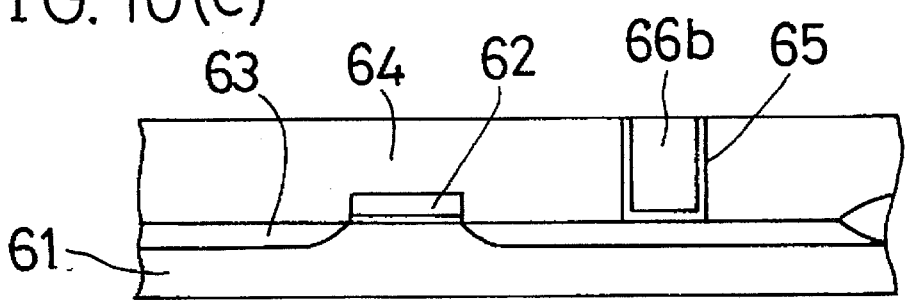
Figure 10D:
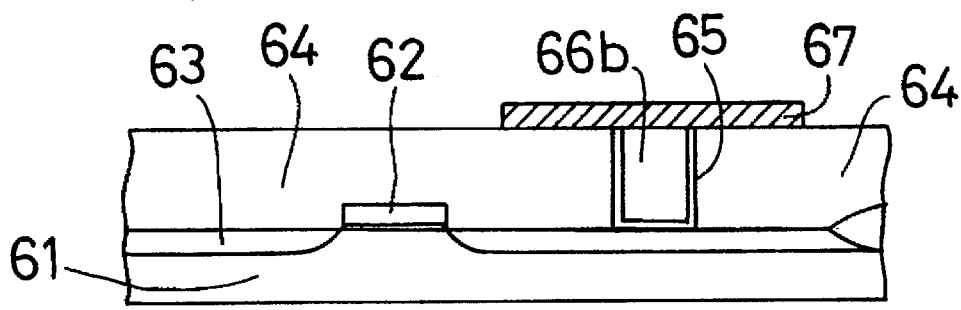

First, an MOS transistor having a gate insulation film, a gate electrode 62 and a diffusion layer 63 is formed on the silicon substrate 61 by a conventional technique. After this, a first insulation film 64 is deposited and a resist (not shown) is deposited on the first insulation film 64. After the resist is patterned by photolithographic process, a contact hole is formed by RIE method or the like (FIG. 10(a)).

After removing the resist, a Ti film 65 is formed on the first insulation film 64 including the contact hole by DC magnetron sputtering method so as to obtain a good ohmic contact with the diffusion layer 63. Preferably, the thickness of the Ti film 65 is about 500 Å to about 1000 Å in order to obtain a good ohmic characteristic. As a material for Ti film 65, titanium tetrachloride is used and as a reducing gas, methylhydrazine or ammonia is used. The material for Ti is not specifically limited to the above material and may be an organic metal material such as tetrakisdimethylaminotitanium or the like.

Next, as a material having a barrier property against the bottom electrode, TiN layer 66a is deposited on the entire surface of the resulting substrate including the contact hole by CVD method. The TiN layer 66a is formed by heating the substrate to about 400° C. to about 600° C., introducing the above material onto the substrate 61, and keeping the pressure reduced to about 1 Torr to about 5 Torr. When the diameter of the contact hole is about 0.5 µm, the material is preferably deposited to a thickness of about 7000 Å to about 10000 Å so as to completely bury the contact hole with the TiN layer 66a (FIG. 10 (b)). If sputtering method is used, it is difficult to completely bury the contact hole because of its poor step coverage. Therefore, CVD method is employed in this Example.

Then, the TiN film 66a on the first interlayer insulation film 64 is etched back with Cl$_2$, SF$_6$ or CF$_4$. After the etching back process, the TiN layer 66a remains only inside of the contact hole as a TiN plug 66b (FIG. 10(c)). Also, the step difference observed in a conventional barrier layer can be reduced by using a TiN plug 66b as the contact plug and disposing no barrier layer between the first interlayer insulation film 64 and the bottom electrode 67.

Next, a platinum (Pt) film for the bottom electrode 67 is formed. Preferably, Pt film is formed to have a thickness of about 1000 Å by sputtering method. The material for the bottom electrode 67 is not specifically limited to Pt and may be an oxide conductive material such as RuO$_2$, ReO$_3$ or the like. Preferably, the bottom electrode 67 made of such material is also formed to have a thickness of about 1000 Å. After the platinum film is formed, a resist (not shown) is patterned by photolithographic process and the bottom electrode 67 is formed by RIE method (FIG. 10(d)).

Then, a titanium oxide film, a zirconium oxide film or the like is formed on the bottom electrode 67 by CVD method as a diffusion prevention film 68 for preventing the reaction of the ferroelectric film 69 and the first interlayer insulation film 64. The source material for titanium oxide or zirconium oxide is preferably a metal alkoxide thereof. For example, $Ti(OC_2H_5)$, $Ti(i-OC_3H_7)_4$, $Ti(t-OC_4H_9)_4$ or the like may be preferably used as a Ti material, and $Zr(i-OC_3H_7)_4$, $Zr(i-OC_4H_9)_4$, $Zr(C_{11}H_{19}O_2)$ or the like may be preferably used as a Zr material. Formation of the titanium oxide ($TiO_2$) film and the zirconium oxide ($ZrO_2$) film by CVD method involves bubbling the above material with inert gas and introducing the material together with the volatilized vapor onto the silicon substrate 61 under reduced pressure of about 1 Torr to about 5 Torr. Preferably, the silicon substrate 61 is heated up to the temperature of about 400° C. to about 500° C., and $O_2$ or $O_3$ is used as a reaction gas. $TiO_2$ film or $ZrO_2$ film is deposited preferably to a thickness of 1.5 to 2 times that of the bottom electrode 67.

Figure 10E:
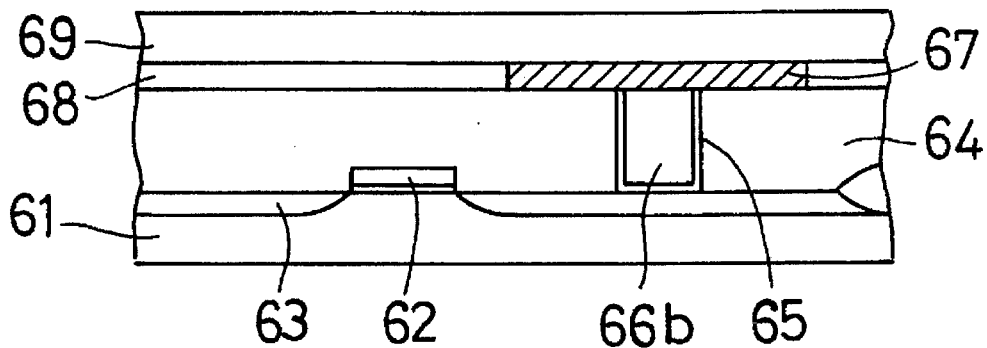
Figure 10F:
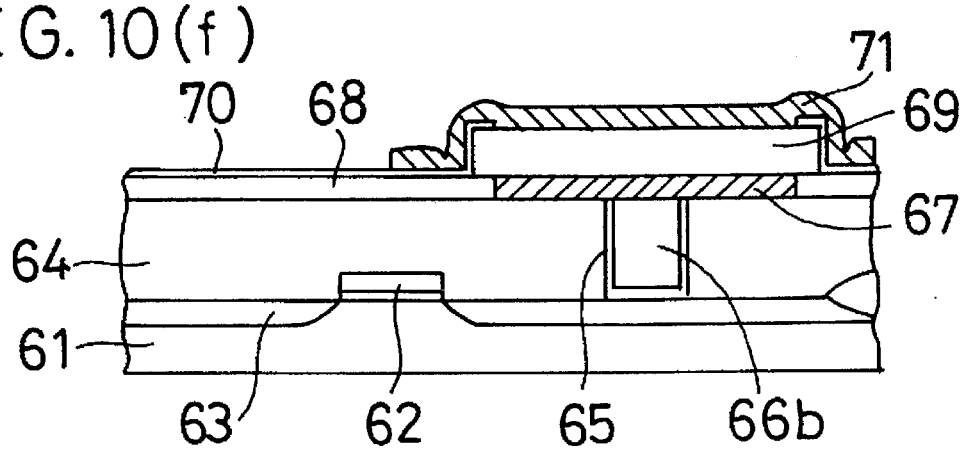
Figure 10G:
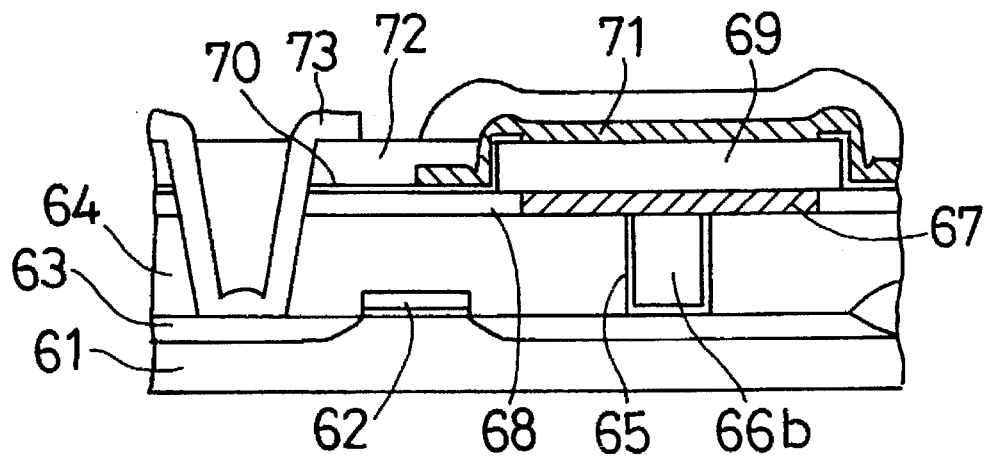

After this, the titanium oxide film or the zirconium oxide film for the diffusion prevention film 68 is polished by CMP (Chemical Mechanical Polishing) method to planarize the surface until the surface of the bottom electrode 67 is exposed (FIG. 10(e)). Preferably, the diffusion prevention film 88 is such that a good and stable insulation property can be obtained between the ferroelectric film 69 and the underlying first interlayer insulation film 64 when the ferroelectric film is treated with heat.

Next, the ferroelectric film 69 is formed on the entire surface of the silicon substrate 61 by sol-gel method or the like and is crystallized by lamp heating or in an electric furnace. The crystallization temperature largely varies depending on the ferroelectric material to be used, but about 600° C. to about 700° C. is preferable for PZT film or PLZT film (FIG. 10 (f)). The method for forming the ferro-electric film 69 according to the present invention is not specifically limited to the sol-gel method and, alternatively, CVD method or sputtering method may be employed. When CVD method or high temperature sputtering method is used, the above process of crystallizing the ferroelectric film 69 can be omitted.

Upon patterning the ferroelectric film 89, a second interlayer insulation film 70 is formed. After removing some portion of the second interlayer insulation film 70 on the ferroelectric film 69, a top electrode 71 serving as a drive line is formed to a thickness of about 1000 Å. Next, a silicon nitride film, a PSG film or a BPSG film is formed as a third interlayer insulation film 72. A contact hole is formed on the source side of the MOS transistor, and a bit line 73 is formed with metal wiring (FIG. 10(g)).

EXAMPLE 5

Figure 11A:
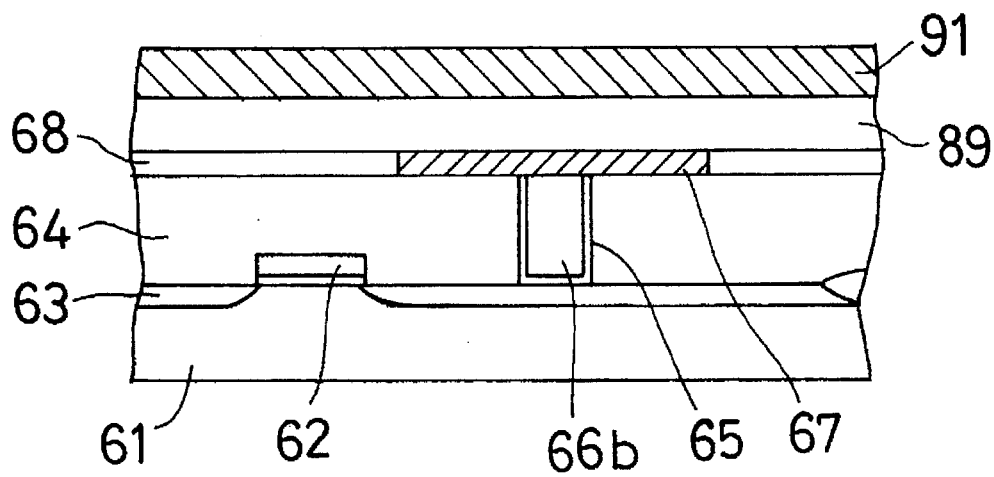
FIGS. 11(a) to 11(c) are schematic fabrication process flow diagrams illustrating still another method for fabricating a ferroelectric capacitor of the FRAM cell of the present invention.
Figure 11B:
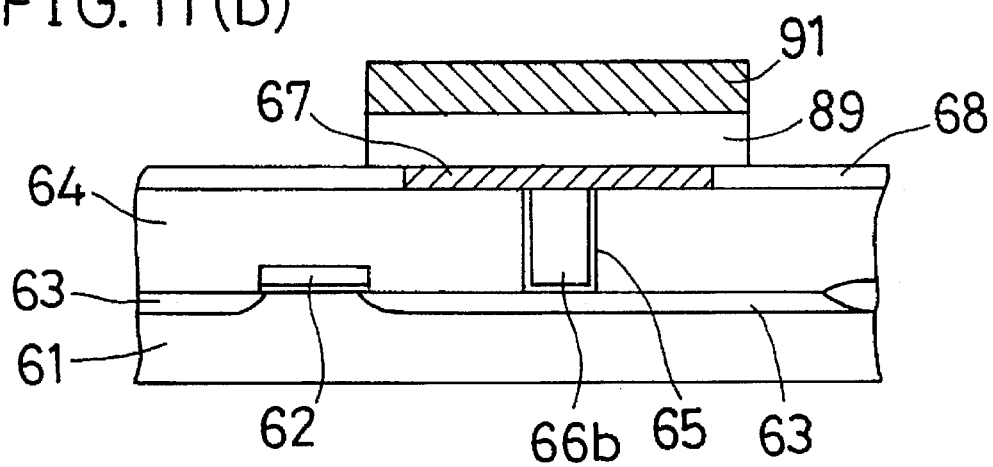

First, following the steps such as in Example 4 (FIGS. 10(a) to 10(e)), the diffusion prevention film 68 is polished for planarizing the surface until the surface of the bottom electrode 67 is exposed. Then a ferroelectric film 89 is formed on the entire surface of the silicon substrate 61 by sol-gel method or the like and is crystallized by lamp heating or in an electric furnace. The crystallization temperature largely varies depending on the ferroelectric material to be used, but 600° C. to 700° C. is preferable for PZT film or PLZT film. Further, a Pt film is formed to a thickness of about 1000 Å as a top electrode 91 on the ferroelectric film 69 (FIG. 11(a)), followed by patterning with photolithographic process. Material for the top electrode 91 is not specifically limited to Pt but may be an oxide conductor or the like. The top electrode 91 and the ferroelectric film 89 are patterned by dry-etching with using a single mask (FIG. 11(b)).

Figure 11C:
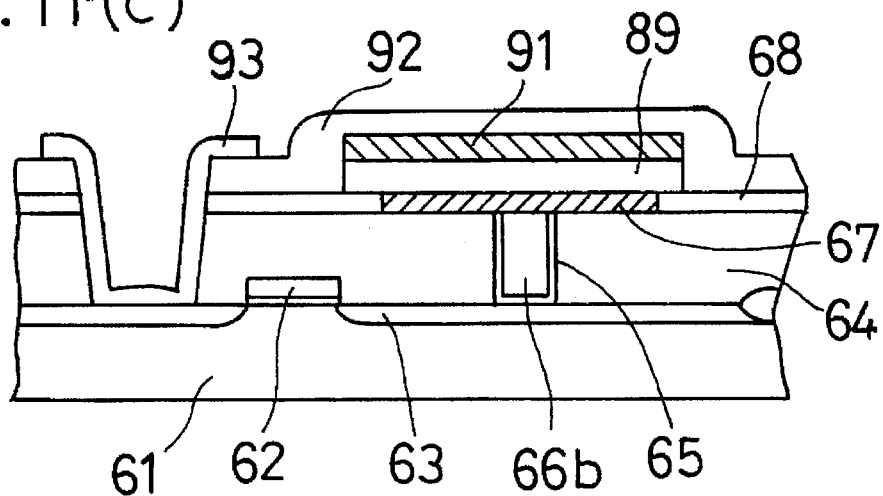
Figure 12:
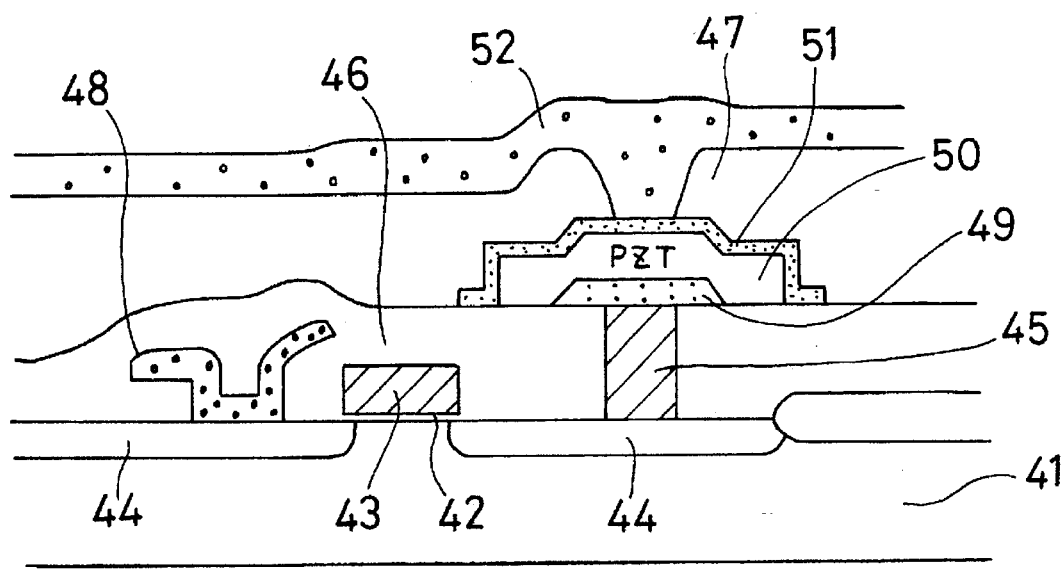
FIG. 12 is a schematic sectional view illustrating one exemplary memory cell of a conventional stacked FRAM.
Figure 13:
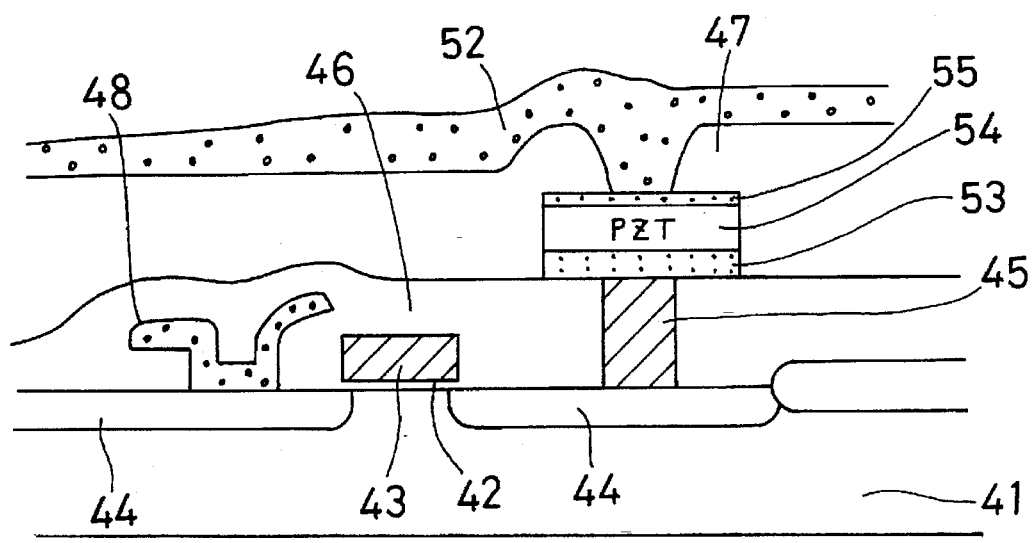
FIG. 13 is a schematic sectional view illustrating one exemplary memory cell of another conventional stacked FRAM.

Next, a silicon nitride film, a PSG film or a BPSG film is formed as a third interlayer insulation film 92. A contact hole is formed on the source side of the MOS transistor, and a bit line 93 is formed with metal wiring (FIG. 11(c)).

In the FRAM according to the present invention, where the spacer of the diffusion prevention film is provided on the side walls of the capacitor ferroelectric film and top electrode of the ferroelectric capacitor, portions of the capacitor ferroelectric film appearing on the side faces and bottom face thereof are completely isolated from the interlayer insulation film of an $SiO_2$ film, NSG film or BPSG film. Therefore, the degradation and peeling-off of the capacitor ferroelectric film can be prevented which would occur due to direct contact of the capacitor ferroelectric film with the interlayer insulation film.

Thus, a highly reliable capacitor can be obtained, thereby increasing the reliability of the entire FRAM.

In the FRAM fabrication method according to Example 1 of the present invention, the patterning of the bottom electrode and the ferroelectric film is followed by the formation of an opening in the lamination of the diffusion prevention film and the thin insulation film, and then followed by the patterning of the top electrode. Therefore, the side walls of the capacitor ferroelectric film are assuredly covered with lamination of the diffusion prevention film and thin insulation film, which prevents the degradation and peeling-off of the capacitor ferroelectric film. Thus, the fabrication of a highly reliable FRAM can be realized.

In the FRAM fabrication method according to Example 2 of the present invention, the formation of the ferroelectric capacitor can be achieved by using only two masks for the patterning of the bottom electrode and fop the patterning of the ferroelectric film and top electrode. Therefore, the FRAM fabrication method requires a reduced number of process steps, thereby reducing the production cost. Since the etching of the ferroelectric film is performed after the top electrode is formed thereon, the etching damage to the ferroelectric film can be suppressed. Thus, a highly reliable high-quality capacitor can be fabricated, thereby providing for a highly reliable FRAM. Further, the use of a reduced number of masks contributes to a reduction in the design margin, thereby virtually reducing the size of the top electrode. This reduces an effective area to be occupied by the capacitor, allowing for the fabrication of a highly integrated FRAM with an integration level comparable to that of a DRAM.

Also, the method (C) of fabricating a non-volatile random access memory according to the present invention provides an effect such that, since the surface of the diffusion prevention film and that of the bottom electrode are formed in an identical plane with no step difference caused by the bottom electrode, the interlayer insulation film formed on the capacitor can be thinned, leading to reduction of surface step difference (the final step difference being controlled to about 3000 Å to 4000 Å according to the present invention) whereby the drive line can be easily formed.

Moreover, separate etching for patterning the bottom electrode and the ferroelectric film can suppress the generation of reaction products of Pt adhering to the side wall of the ferroelectric film which is caused by simultaneous etching of the bottom electrode and the ferroelectric film.

Further, insulation property which is good and stable against the process of heating the ferroelectric film can be secured between the ferroelectric film and the underlying interlayer insulation film by providing a diffusion prevention film between the first interlayer insulation film and the ferroelectric film.

Alternatively, the method (D) of fabricating a nonvolatile random access memory according to the present invention provides the following effect. After the bottom electrode is formed, the planarization is carried out using the diffusion prevention film that serves to prevent the reaction of the ferroelectric film and the interlayer insulation film. Also, the ferroelectric film is formed wider than the bottom electrode so as to cover at least the entire surface of the bottom electrode. Therefore, even if a reaction product of Pt produced by simultaneous etching of the top electrode and the ferroelectric film adheres to the side wall of the ferroelectric film, no short circuit is generated between the top electrode and the bottom electrode by the reaction product. Accordingly, the top electrode and the ferroelectric film can be formed using a single mask, so that the number of manufacturing steps can be reduced and the drive line can be easily formed.

Also, by providing no diffusion barrier film between the first interlayer insulation film and the bottom electrode, it is possible to reduce the step difference conventionally generated by a diffusion barrier film.

What is claimed is:

1. A non-volatile random access memory comprising:

an MOS transistor having a gate insulation film formed on a semiconductor substrate, a gate electrode formed on the gate insulation film, and a pair of diffusion layers formed in the semiconductor substrate; and a ferroelectric capacitor having a bottom electrode connected to one of the diffusion layers of the MOS transistor, a capacitor ferroelectric film formed only on the bottom electrode, and a top electrode formed on the capacitor ferroelectric film;

wherein at least side walls of the bottom electrode and the capacitor ferroelectric film are coated with lamination of a diffusion prevention film and a thin insulation film; an upper surface of the capacitor ferroelectric film is contacted with the top electrode; the other diffusion layer of the MOS transistor is connected to a bit line; the gate electrode is connected to a word line; and the top electrode of the ferroelectric capacitor is constituted so as to serve as a drive line.

2. A non-volatile random access memory as set forth in claim 1, wherein the diffusion prevention film is formed of a material selected from the group consisting of $TiO_2$, $ZrO_2$ and $Al_2O_3$.

3. A non-volatile random access memory as set forth in claim 1, wherein the thin insulation film is formed of an $SiO_2$ or SiN.

4. A non-volatile random access memory as set forth in claim 1, wherein the diffusion prevention film is formed in the thickness of 300 Å to 1000 Å and the thin insulation film is formed in the thickness of 500 Å to 1500 Å.

5. A non-volatile random access memory comprising:

an MOS transistor having a gate insulation film formed on a semiconductor substrate, a gate electrode formed on the gate insulation film, and a pair of diffusion layers formed in the semiconductor substrate;

an interlayer insulation film covering the MOS transistor; and a ferroelectric capacitor having a bottom electrode connected to one of the diffusion layers of the MOS transistor through a contact hole formed in the interlayer insulation film on said one diffusion layer, a capacitor ferroelectric film covering the bottom electrode, and a top electrode formed on the capacitor ferroelectric film;

wherein a diffusion prevention film is formed between the interlayer insulation film and the capacitor ferroelectric film; the other diffusion layer of the MOS transistor is connected to a bit line; the gate electrode is connected to a word line; and the top electrode of the ferroelectric capacitor is constituted so as to serve as a drive line.

6. A non-volatile random access memory as set forth in claim 5, wherein side walls of the capacitor ferroelectric film and the top electrode are covered with a spacer made of a material identical with or different from that of the diffusion prevention film.

7. A non-volatile random access memory as set forth in claim 5, wherein the diffusion prevention film is formed of a material selected from the group consisting of $TiO_2$, $ZrO_2$ and $Al_2O_3$.

8. A non-volatile random access memory as set forth in claim 5, wherein the diffusion prevention film is formed in the thickness of 300 Å to 1000 Å.

* * * * *